United States Patent [19]

Kromer, III et al.

[11] 4,355,402
[45] Oct. 19, 1982

[54] DATA MODEM FALSE EQUILIBRIUM CIRCUIT

[75] Inventors: Philip F. Kromer, III; Ran F. Chiu; Ming L. Kao, all of Miami; Henry H. Parrish, Miami Springs, all of Fla.

[73] Assignee: Racal-Milgo, Inc., Miami, Fla.

[21] Appl. No.: 952,856

[22] Filed: Oct. 19, 1978

[51] Int. Cl.³ .............................................. H04L 27/08
[52] U.S. Cl. ..................................... 375/11; 375/98; 375/17; 371/5; 371/56; 364/701
[58] Field of Search ................... 325/41, 42, 65, 38 A, 325/321, 323, 326; 179/68 D; 328/162; 375/76, 12, 14, 20, 98, 113, 11, 17, 19, 13, 15, 16; 307/233 R, 233 A, 350, 351, 360; 340/213 R, 213 Q, 248 A, 248 B, 248 C; 364/581, 582, 701, 724; 371/5, 28, 57, 61, 64, 46, 48, 56; 333/18

[56] References Cited

U.S. PATENT DOCUMENTS

| | | | |
|---|---|---|---|
| 3,067,285 | 12/1962 | Turner | 375/113 |
| 3,267,459 | 8/1966 | Chomicki et al. | 325/38 A |
| 3,404,232 | 10/1968 | Burford | 328/162 |
| 3,509,279 | 4/1970 | Martin et al. | 325/326 |
| 3,534,273 | 10/1970 | Thomas | 328/162 |
| 3,671,867 | 6/1972 | Schwarz | 375/98 |
| 3,716,780 | 2/1973 | Van Elk et al. | 325/326 |
| 3,731,199 | 5/1973 | Tazaki et al. | 375/98 |
| 3,736,511 | 5/1973 | Gibson | 325/321 |
| 3,757,221 | 9/1973 | Moehrmann | 375/98 |
| 4,011,405 | 3/1977 | Ridout et al. | 325/38 A |
| 4,110,691 | 8/1978 | Lender | 371/56 |
| 4,161,628 | 7/1979 | McRae | 375/98 |

FOREIGN PATENT DOCUMENTS

| | | |
|---|---|---|
| 1014756 | 12/1965 | United Kingdom . |
| 1165329 | 9/1969 | United Kingdom . |
| 1322113 | 7/1973 | United Kingdom . |
| 1405437 | 9/1975 | United Kingdom . |
| 1411235 | 10/1975 | United Kingdom . |
| 1441254 | 6/1976 | United Kingdom . |
| 1500608 | 2/1978 | United Kingdom . |
| 2007467 | 5/1979 | United Kingdom . |

*Primary Examiner*—Benedict V. Safourek
*Attorney, Agent, or Firm*—Jackson, Jones & Price

[57] ABSTRACT

Circuitry for detecting and correcting false equilibrium conditions generated in data modems by sudden changes in gain of an associated transmission system including a false gain detector which detects a low rate of production of symbols of largest magnitude and triggers a final gain circuit which initially jumps the overall system gain and thereafter adaptively adjusts the gain jump to the correct value.

10 Claims, 10 Drawing Figures

VSB SYSTEM WITH FALSE GAIN
○ EXPECTED POSITION OF DECISION-MAKER INPUT (IDEAL POINT)
× ACTUAL POSITIONS OF DECISION-MAKER INPUT

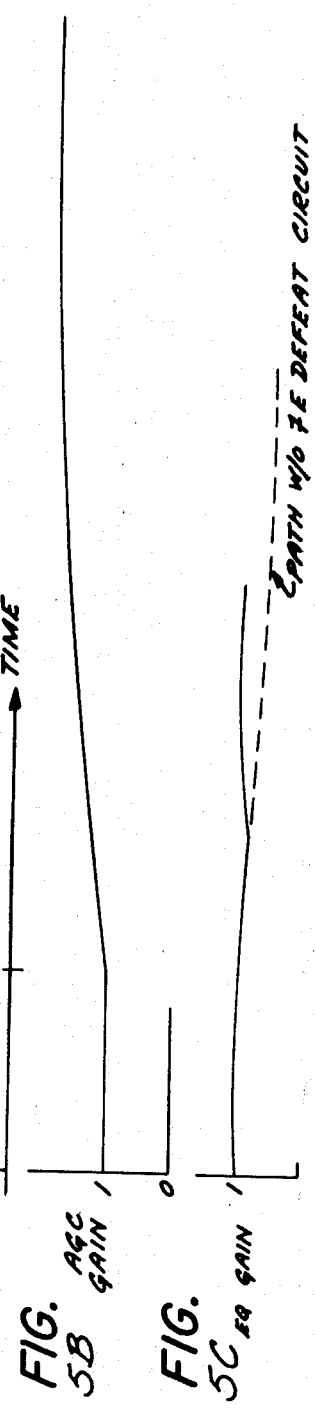
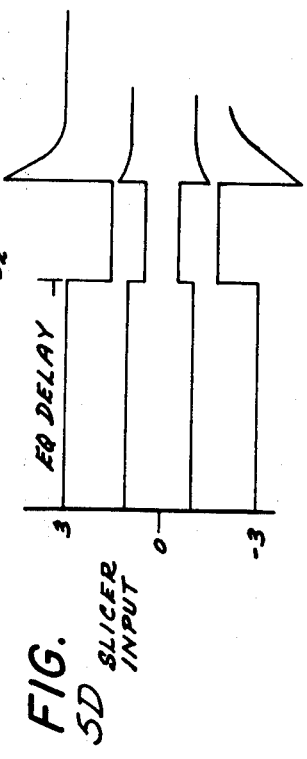
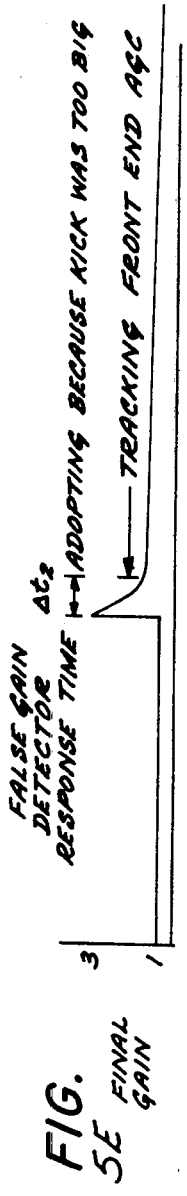
FIG. 5A EQ. INPUT SIGNAL LEVEL
FIG. 5B AGC GAIN
FIG. 5C EQ GAIN
FIG. 5D SLICER INPUT
FIG. 5E FINAL GAIN

DATA MODEM FALSE EQUILIBRIUM CIRCUIT

BACKGROUND OF THE INVENTION

The subject invention relates to data modem circuitry and more particularly to a gain control circuit for detecting and correcting a false equilibrium condition generated in adaptively equalized modems.

Many adaptively equalized data modems employing vestigial sideband (VSB) or quadrature amplitude (QAM) modulation techniques utilize slicing or decision circuits to assign the equalizer output to one of a plurality of possible ideal data levels.

Present art teaches that the "slicer" or decision circuit for modem receivers should produce as an output the ideal point that is closest to the slicer input. (This minimizes the number of errors in the presence of additive white noise at the input to the receiver.) When this slicer rule is followed on a multilevel, automatically equalized system, false equilibrium can arise whereby the equalizer tap settings are correct except for a scale factor and possibly a rotation, (the scale factor and rotation being constant for each and every equalizer tap.)

In any event, this false equilibrium phenomena is characterized by the fact that the equalizer has successfully resolved the transmitted signal into distinct regions, but because the overall system gain is incorrect, the slicer does not assign the received signal to the correct ideal point.

Modems are subject to a phenomenon known as amplitude hits whereby the gain of the transmission medium changes suddenly, then remains at the new gain for a relatively long period. Amplitude hits of a sufficiently large decrease in magnitude may in fact cause the system to seek a false equilibrium.

SUMMARY OF THE INVENTION

Accordingly, it is an object of the invention to prevent errors in data modem receivers generated by false equilibrium conditions;

It is another object of the invention to provide a method and apparatus for detecting false equilibrium conditions and eliminating their undesirable effects, which is suited for microprocessor circuit implementations.

These and other objects and advantages are accomplished according to the invention by providing means for detecting and correcting the false equilibrium condition. An implementation of the invention provides a means for detecting a below-average rate of production of symbols indicative of a false equilibrium condition and a means responsive to such detection for jumping the gain of the input signal into the apparatus which detects the data symbol present in that input signal.

BRIEF DESCRIPTION OF THE DRAWINGS

The preferred embodiment and best mode for practicing the just summarized invention will now be disclosed in conjunction with the drawings of which:

FIGS. 5A-5E are plots of several waveforms illustrating operation of the preferred embodiment of the invention.

DETAILED DESCRIPTION OF THE PREFERRED EMBODIMENT

Figures 1, 2A:
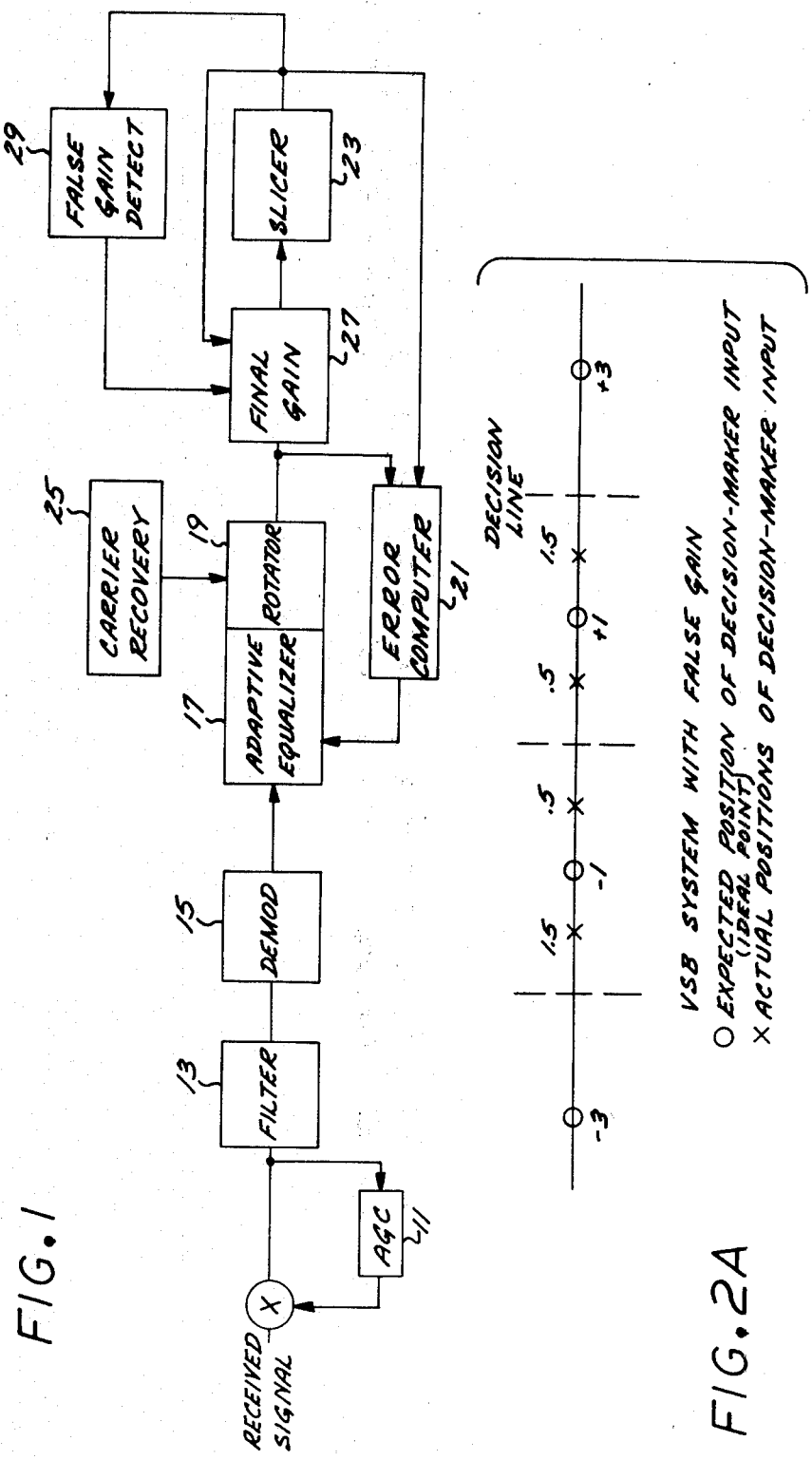
FIG. 1 is a block diagram which illustrates the preferred embodiment of the invention incorporated in a data modem receiver.
FIGS. 2A and 2B illustrate false equilibrium conditions.

FIG. 1 illustrates a modem receiver including an automatic gain control (AGC) section 11, a filter section 13, a demodulator 15, an adaptive equalizer 17, a rotator 19, an equalizer error computer 21, a slicer 23, and a carrier recovery circuit 25 which controls the rotator 19. These elements illustrate a conventional modem receiver. The received signal is gain controlled by the AGC section 11 and filtered by the filter section 13. The filtered and gain controlled signal is then demodulated at block 15 and the result of the demodulation is equalized by the adaptive equalizer 17 and rotator 19. A rotator may or may not be associated with the equalizer 17, depending on the prior art modem structure under consideration. In the prior art, the output of the rotator 19 would typically be fed directly to the slicer 23. The slicer output represents the data symbol present in the slicer input. The input and output of the slicer 23 are then used by the error computer 21 to adjust the adaptive equalizer 17 to compensate for amplitude and delay distortion of the transmission medium.

According to the preferred embodiment, the output of the rotator 19 is supplied to final gain section 27 prior to slicing by slicer 23, and the output of slicer 23 is utilized by a false gain detector 29 to detect a false equilibrium condition. The false gain detector 29 cooperates with the final gain section 27 to form a false equilibrium defeat circuit.

Figure 2B:
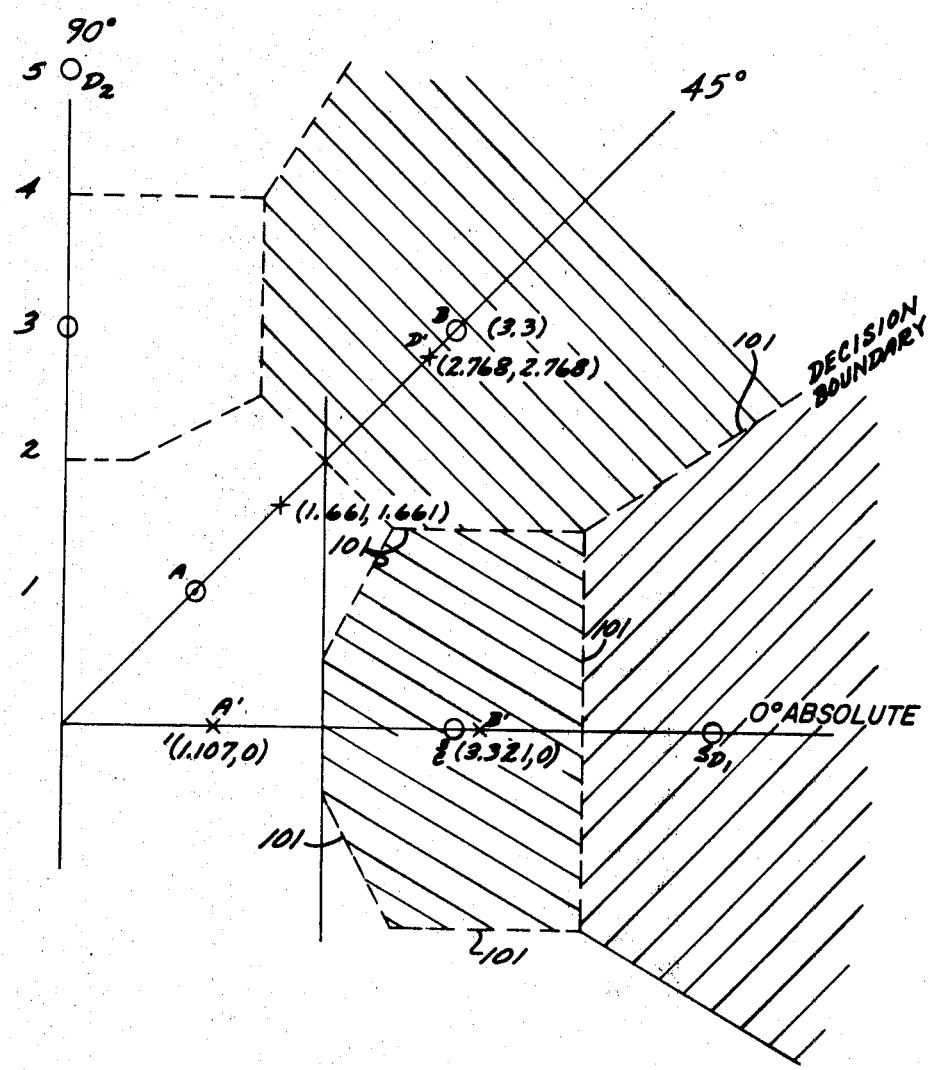

False equilibrium conditions are illustrated in FIGS. 2A and 2B. Such conditions can arise in modem circuitry of FIG. 1 absent a false equilibrium defeat circuit such as that comprising false gain detector 29 and final gain section 27. FIG. 2A illustrates false equilibrium in a VSB receiver. The slicer output levels expected are $-3$, $-1$, $+1$ and $+3$, represented by circles. A false equilibrium condition may shrink the system gain such that the expected levels are reduced to $-1.5$, $-0.5$, $+0.5$ and $+1.5$ respectively. In such case, the equalizer 17 will be in a state such that the mean-square error is zero, but a point which should be assigned an output value of $+3$ by the slicer 23 will instead be assigned to the incorrect value of $+1$.

FIG. 2B illustrates a false equilibrium condition for the CCITT V.29 QAM pattern with a gain of 0.7829 of that expected (2.12 db too low) and an incorrect 45° rotation.

Decision boundaries are indicated by dotted lines 101. The ideal points or symbols determined by the slicer are indicated as circles, A, B, C, $D_1$, $D_2$, the points $D_1$ and $D_2$ being symbols of the largest magnitude. For a slicer input falling within the boundary 101 around point B, the slicer assigns the ideal value B, etc. Points A' and B' indicate the location of slicer inputs representing the image of points A and B as a result of a gain hit. Now point B', which should be assigned the symbol B by the slicer is instead assigned the incorrect symbol C. Equalizer operation will stabilize at the rotated and gain reduced position, causing errors to be made.

According to the preferred embodiment, the false gain detector 29 senses the occurrence of the false equilibrium phenomenon. In the preferred implementation the detector 29 senses an initially low rate of detection of the symbol(s) with the largest amplitude and triggers the final gain unit 27. An alternative means would be to detect an unusually small longterm average amplitude of either the input or the output of the slicer 23.

The Final Gain section 27 is structured such that: On a trigger, the gain is very rapidly increased. Thereafter the circuitry 27 adapts in such a manner as to ultimately adjust the overall system gain to match that expected by the slicer 23. The rate of adaptation is relatively fast compared to that of the equalizer 17 and front-end automatic gain control (AGC) 11.

The action of the circuitry 27, 29 is as follows: Suppose that a false gain does exist, perhaps as the result of an amplitude hit. The False Gain Detector 27 trips eventually and forces the Final Gain Circuit 29 to suddenly increase the system gain. Since there are no false equilibria with too large a gain, the Final Gain Stage 29 adapts to the correct value and the slicer 23 generates the correct values. Eventually the front end AGC 11 and the equalizer 17 adapt to the correct gain and the Final Gain Stage 29, which is fast enough to track the changes in gain introduced by the other circuitry, settles to unity gain.

Figure 3:
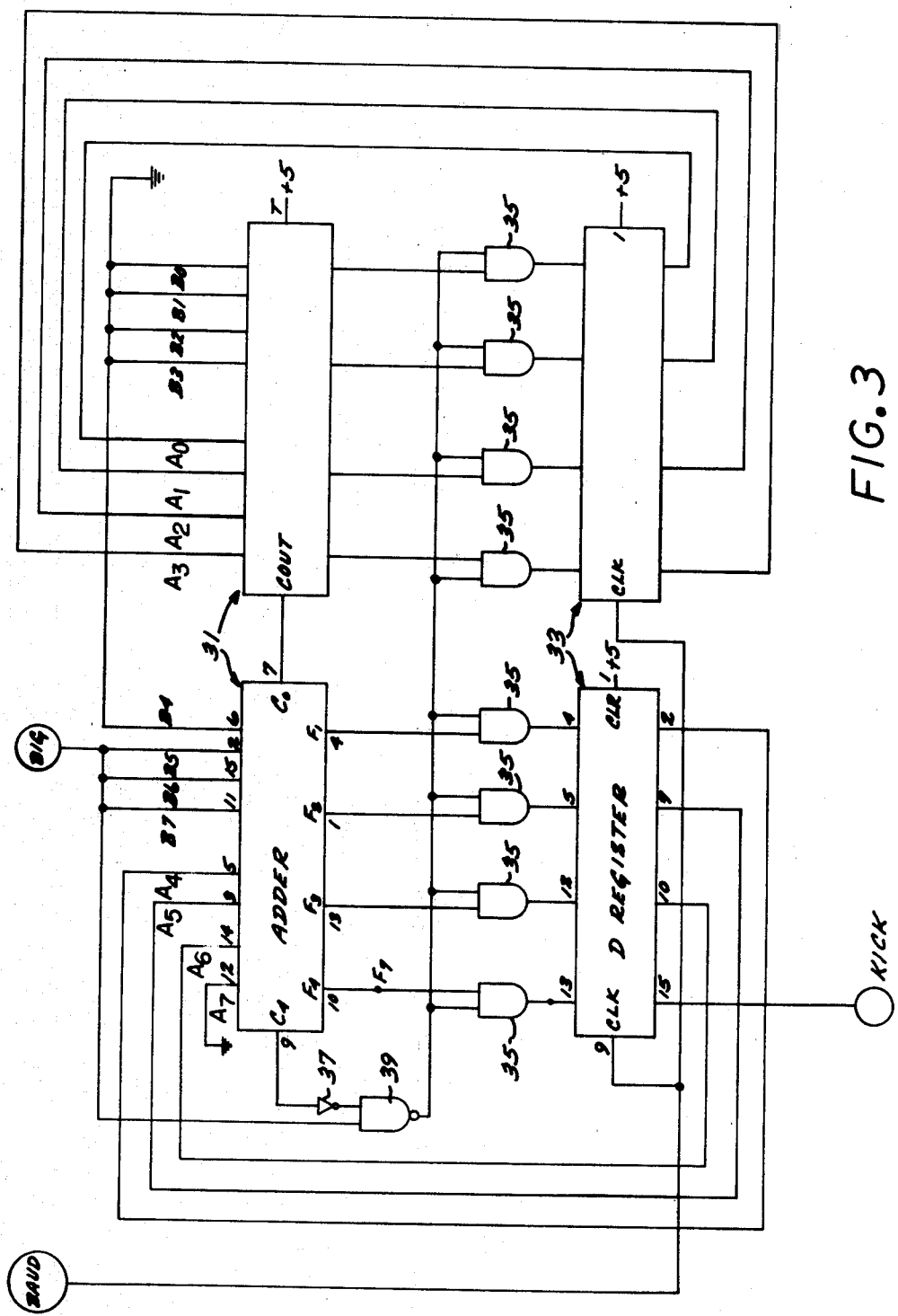
FIG. 3 is a schematic diagram illustrating the false gain detector means of the preferred embodiment of the invention.

The preferred embodiment of the False Gain Detector 29 for the pattern shown in FIG. 2B (the CCITT V.29 QAM pattern) is shown in FIG. 3. In FIG. 2B, normally symbol type D, the symbol of largest magnitude, occurs on the average of once in four symbols due to the action of the randomizer (scrambler). The slicer 23 generates a logic 1 coincident with the symbol rate strobe (denoted Baud), if the detected symbol is of type D, otherwise it generates a logic 0. We call this signal BIG. The detector 29 of FIG. 3 employs an adder 31 and a register 33 to ascertain whether BIG is "1" on the average of once every four symbols.

If BIG is true, then by the virtue of its connection to the adder 31, a binary representation of $-32$ is applied to the B input of the two's complement adder 31. The output of the register 33 is applied to the A input of the adder 31, labeled $A_0, A_1, A_2 \ldots A_7$. If the result of the addition of the A and B inputs is negative, i.e. the carry output C4 of the adder 31 is low, the register 33 is cleared via an invertor 37 and two AND gates 35, 39 on the next rising edge of Baud; otherwise the adder output is strobed into the register 33 on the next rising edge of Baud. In the latter case the operation just described may be summarized by the expression: $R_{n+1} = R_n - 31$ where "R" is the content of the register 33 and the subscript "n", as hereafter set forth, indicates the particular time (symbol interval) during which the register contents are examined.

If BIG is false, then via the adder 31, the contents of the register 33 will be incremented by 1. If the contents of the register 33 exceed 127, the adder output F7 goes high. On the next rising edge of Baud, F7 is strobed into the register 33 causing 'KICK' to go high. This signals the Final Gain Stage 27 to introduce a step in amplitude.

Figure 4:
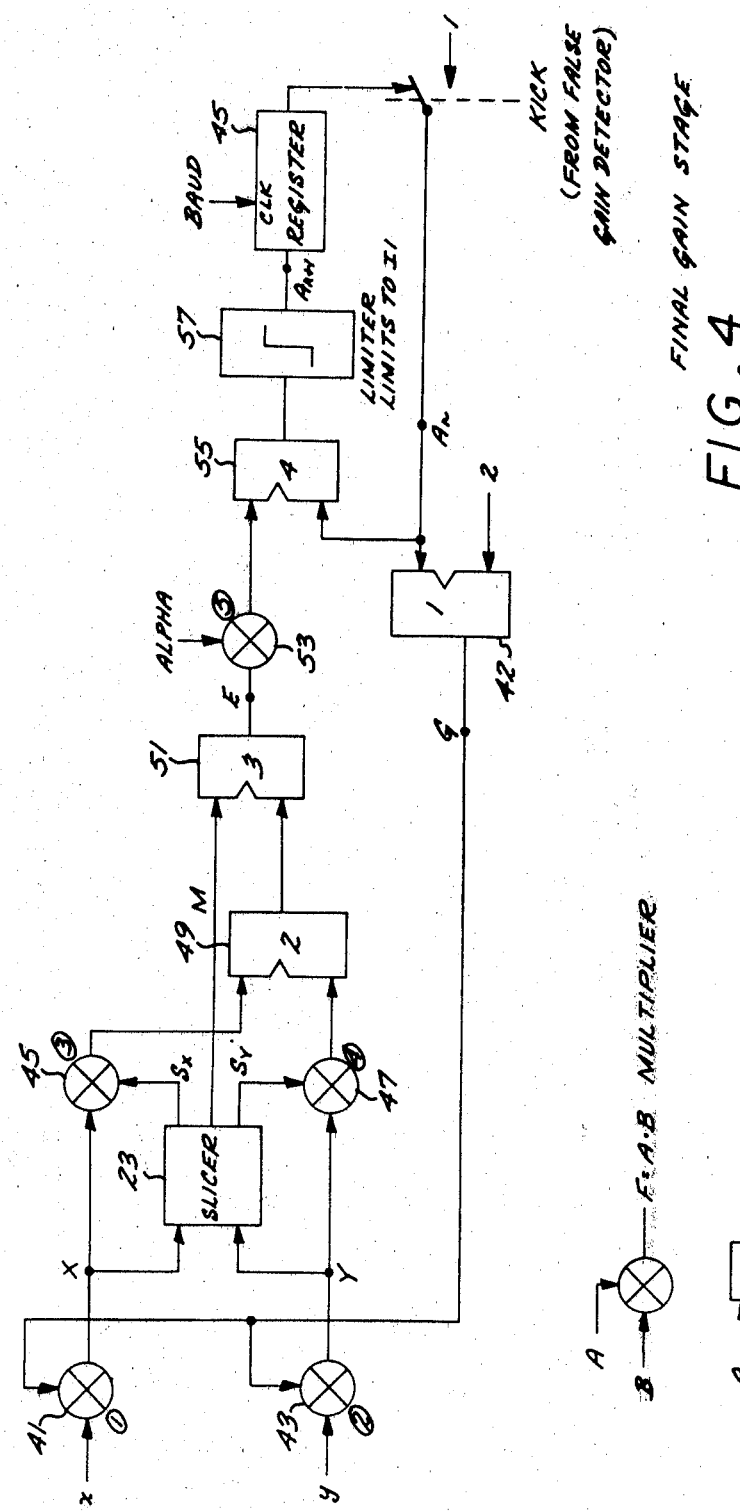
FIG. 4 is a schematic diagram illustrating the final gain stage of the preferred embodiment.

The Final Gain Stage 27 of the preferred embodiment is illustrated in FIG. 4. The Baud sampled equalizer output, the pair (x, y) are respectively multiplied by a gain factor G by multipliers 41, 43. The gain factor G is formed by an adder 42, which adds the constant two (2) to a quantity $A_n$. $A_n$ is equal to the output of a delay element, Register 45, unless the output KICK of the False Gain Detector is active, in which case $A_n$ is the constant one (1). Thus, $G = 2 + A_n$ if KICK is not active, and $G = 3$ if KICK is active.

The outputs of the multipliers 41, 43 are respectively $$X_n = G_n \cdot X_n$$

$$Y_n = G_n \cdot Y_n$$

where n indicates the symbol interval of interest. The $(X_n, Y_n)$ pair is applied to the slicer 23 which generates the ideal point pair $(S_x, S_y)$ as an input to respective second multipliers 45, 47. The second respective inputs to multipliers 45, 47 are the outputs $X_n, Y_n$ of multipliers 41, 43. The outputs of the second multipliers 45, 47 are summed by an adder 49 to form one input to a second adder 51 whose other input M is an output of the slicer 23. The action of multipliers 45, 47 and adders 51, 53 is to produce a quantity E, where $E = S_x * X + S_y * Y + M$.

The quantity M is a quantity generated by the slicer such that:

$$M = -(S_x^2 + S_y^2)$$

The quantity E is an indicator of the gain error, positive indicating too large a gain. The quantity E is multiplied by a constant Alpha in a third multiplier 53. Alpha controls the speed of the response of the final gain stage. A fourth adder 55 combines $A_n$ and Alpha *E to produce $A_{n+1}$, where $A_{n+1} = A_n - \text{Alpha} *E$. $A_{n+1}$ passes through a limiter 57 which limits $A_{n+1}$ to the range $-1$ to $+1$. $A_{n+1}$ is then loaded into the Register 45, to be used for the next sample.

Note that in this implementation, the Final Gain will be in the range $+3$ to $+1$, corresponding to $A_n$ in the range $+1$ to $-1$. The system will eventually stabilize with $A_n = +1$. Other ranges are useful, depending on the multi-level pattern being sent, but the gain should be limited to a positive value in order to prevent the loop from going unstable.

FIG. 5 illustrates the overall operation of the preferred embodiment. FIG. 5A illustrates the input signal level to the equalizer 17 vs. time. FIG. 5B illustrates the gain of AGC 11 vs. time. FIG. 5C illustrates the gain of the equalizer 17. FIG. 5D illustrates the input to slicer 23 vs. time, and FIG. 5E illustrates the gain of the Final Gain Stage 27.

At time $t_1$ a gain hit occurs. The equalizer input level drops and the AGC gain begins to attempt a relatively slow correction. After a delay occasioned by the equalizer 17, the slicer input drops into a false equilibrium range at time $t_2$. The equalizer gain begins a relatively slow decline toward a value commensurate with the false equilibrium condition as indicated by the dotted line in FIG. 5C. Operation would then be stabilized in the false equilibrium condition. However, after a time delay $\Delta t$, the false gain detector 29 kicks the Final Gain Stage 27 and the Final Gain of FIG. 5E jumps to $+3$. This gain increment raises the slicer input level out of the false equilibrium state. Assuming the final gain increment is too large, the final gain stage 27 adapts to reduce the gain over the interval $\Delta t_2$ after which the final gain tracks the AGC gain of FIG. 5B.

As will be apparent to those skilled in the art, many modifications and adaptations of the just described preferred embodiment may be made without departing from the scope and spirit of the invention. Therefore, it is to be understood that, within the scope of the appended claims, the invention may be practiced other than as specifically described herein.

What is claimed is:

1. In a data modem having a receiver gain and means for detecting symbols of a plurality of discrete magnitudes from an input signal and for providing an output indicative of the symbols detected, the apparatus comprising:

means responsive to the symbol detecting means for detecting a below-average rate of detection of symbols of one of said magnitudes and producing a trigger signal indicative of the detection of said below-average rate; and means responsive to said trigger signal for modifying the receiver gain.

2. The apparatus of claim 1 wherein said means responsive to said trigger signal is further responsive to said input signal for increasing the gain applied to said input signal.

3. The apparatus of claim 1 or 2 wherein the magnitude of the symbol detected by said means for detecting a below-average rate of detection is the largest magnitude produced by said symbol detecting means.

4. The apparatus of claim 2 wherein said gain increasing means in response to said trigger signal provides an initial jump in said gain and then adaptively reduces its contribution to said gain.

5. The apparatus of claim 1 wherein said below-average rate detecting means includes an adder means responsive to the detection and non-detection by the symbol detecting means of symbols of said one magnitude and a register means whose contents are controlled by said adder means, said adder means also being responsive to the contents of said register means.

6. The apparatus of claim 2 wherein said means responsive to said trigger signal comprises:

means for multiplying said input signal by a gain factor;

means for producing an error signal indicative of the departure of said input signal from a desired gain value; and means for jumping said gain factor in response to said trigger signal and reducing said gain in response to said error signal.

7. The apparatus of claim 6 wherein said producing means includes means for multiplying the input to said symbol detecting means by the output thereof.

8. In a modem having a receiver system gain and a decision means operative on the output of an equalizer means to resolve said output into one of a plurality of data symbols and subject to a false equilibrium condition wherein the system gain is reduced to a level of operation, the resolution of data symbols by said decision means is incorrect, the improvement comprising:

means responsive to the resolution of data symbols for detecting and correcting said false equilibrium condition.

9. The apparatus of claim 8 wherein said means for detecting and correcting detects false equilibrium by detecting an incorrect average production of said data symbols.

10. The apparatus of claim 8 or 9 wherein said false equilibrium is corrected by jumping the gain applied to the input to said decision means.

* * * * *

UNITED STATES PATENT AND TRADEMARK OFFICE
CERTIFICATE OF CORRECTION

PATENT NO. : 4,355,402
DATED : October 19, 1982
INVENTOR(S) : Phillip F. Kromer

It is certified that error appears in the above—identified patent and that said Letters Patent is hereby corrected as shown below:

In Claim 8, Column 6, Line 20, after "level" insert --wherein said equalizer and decision means are at stable levels--;

In Claim 8, Column 6, Line 21, after "operation," insert --but--.

Signed and Sealed this

Nineteenth Day of March 1985

[SEAL]

Attest:

DONALD J. QUIGG

Attesting Officer    Acting Commissioner of Patents and Trademarks